(12) United States Patent
Urbach et al.

(10) Patent No.: US 7,687,947 B2
(45) Date of Patent: Mar. 30, 2010

(54) ELECTRIC MOTOR COMPRISING AN ELECTRONIC UNIT WITH A PUNCHED GRID

(75) Inventors: Peter Urbach, Reutlingen (DE); Wolfgang Feiler, Reutlingen (DE); Thomas Raica, Hechingen (DE); Stefan Hornung, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 94 days.

(21) Appl. No.: 10/577,965

(22) PCT Filed: Oct. 29, 2004

(86) PCT No.: PCT/EP2004/052720

§ 371 (c)(1),
(2), (4) Date: May 3, 2006

(87) PCT Pub. No.: WO2005/046020

PCT Pub. Date: May 19, 2005

(65) Prior Publication Data

US 2007/0133183 A1   Jun. 14, 2007

(30) Foreign Application Priority Data

Nov. 8, 2003   (DE) ............................... 103 52 079

(51) Int. Cl.
*H02K 11/00* (2006.01)
(52) U.S. Cl. ....................................... 310/71; 310/68 R
(58) Field of Classification Search ................... 310/71, 310/68 R
See application file for complete search history.

(56) References Cited

U.S. PATENT DOCUMENTS

| | | | | |
|---|---|---|---|---|
| 4,563,811 A | * | 1/1986 | Cranston ..................... | 29/827 |
| 4,710,795 A | * | 12/1987 | Nippert et al. .............. | 257/692 |
| 4,734,753 A | * | 3/1988 | Cranston et al. ............ | 257/741 |
| 4,952,829 A | * | 8/1990 | Armbruster et al. ....... | 310/68 D |
| 5,213,748 A | * | 5/1993 | Biswas et al. ............... | 264/251 |
| 5,640,746 A | * | 6/1997 | Knecht et al. .............. | 29/25.35 |
| 5,652,471 A | * | 7/1997 | Mayer et al. .............. | 310/68 D |
| 5,697,811 A | * | 12/1997 | Pickles et al. ............... | 439/532 |
| 6,060,795 A | | 5/2000 | Azotea et al. | |

(Continued)

FOREIGN PATENT DOCUMENTS

DE          34 06 528          8/1985

(Continued)

*Primary Examiner*—Quyen Leung
*Assistant Examiner*—Alex W Mok
(74) *Attorney, Agent, or Firm*—Michael Best & Friedrich LLP (57) ABSTRACT

Electric motor (10), in particular for adjusting moving parts in a motor vehicle, comprising an electronic unit (70) with a sandwich construction, which contains a first electrically conductive substrate (71) and a second electric conductive substrate (72), between which power components are located and electrically connected to both substrates (71, 72), and a side (84) of the second substrate (72) facing away from the first substrate (71) is equipped with additional electronic components (56), wherein the first substrate (71) is embodied as a punched grid (44), which together with the second substrate (72) is extrusion coated with a plastic body (95) in such a way that the extensions (97) of the punched grid (44) protrude from the plastic body (95), forming an electrical and/or mechanical interface (98) for connecting additional motor components (99, 38, 40, 104, 102, 80).

25 Claims, 3 Drawing Sheets

U.S. PATENT DOCUMENTS

| | | |
|---|---|---|
| 6,127,727 A | 10/2000 | Eytcheson |
| 6,274,955 B1 * | 8/2001 | Satoh et al. .................... 310/71 |
| 6,317,332 B1 * | 11/2001 | Weber et al. ................. 361/760 |
| 6,326,683 B1 * | 12/2001 | Houdeau et al. ............. 257/679 |
| 6,420,018 B1 * | 7/2002 | Inoue et al. ................. 428/209 |
| 6,432,749 B1 * | 8/2002 | Libres ........................ 438/122 |
| 6,440,750 B1 * | 8/2002 | Feygenson et al. .............. 438/3 |
| 6,697,257 B1 * | 2/2004 | Wolf et al. ................... 361/708 |
| 2002/0127778 A1 * | 9/2002 | Karenzos et al. ............ 438/122 |
| 2003/0080772 A1 * | 5/2003 | Giacomini et al. ........... 324/771 |
| 2003/0128080 A1 * | 7/2003 | Viswanathan et al. ....... 333/125 |
| 2003/0138991 A1 * | 7/2003 | Kung ......................... 438/106 |

FOREIGN PATENT DOCUMENTS

| | | |
|---|---|---|
| DE | 43 37 390 | 4/1995 |
| WO | WO 01/27997 | 4/2001 |
| WO | WO 01/63671 | 8/2001 |

* cited by examiner

ELECTRIC MOTOR COMPRISING AN ELECTRONIC UNIT WITH A PUNCHED GRID

BACKGROUND OF THE INVENTION

The invention relates to an electric motor, in particular for adjusting moving parts in a motor vehicle as well as a method for producing said electric motor.

A power semi-conductor module was disclosed in DE 34 06 528 A1 in which at least one semi-conductor element is arranged between two parallel substrates and makes contact with a metallization on the substrates. Ceramic plates are used as substrates, on which all power connections are applied in the form of metallic conductor tracks. The power semi-conductor in this case module can be placed in a housing, which is at least partially filled with an encapsulating material.

If such a semi-conductor module is supposed to be used for triggering an electric motor, then, based on the use of the two metallized ceramic substrates, it forms a separate electronic unit, which cannot be integrated directly into the construction space of the motor housing since it can only make electrical contact with the electric motor via an electronic plug.

SUMMARY OF THE INVENTION

In contrast, the electric motor in accordance with the invention has the advantage that, because of the embodiment of a substrate as a punched grid with extensions, which protrude from the sprayed on plastic body, the electronic unit directly makes electrical and mechanical connections available, which are embodied to be so stable that additional components of the electric motor can be attached directly to the electronic unit. The advantage of this is that the electronic module in the motor construction space can be integrated directly on the armature shaft in the motor, thereby eliminating additional electrical connections and mechanical holders for specific motor components.

The advantage of the method in accordance with the invention for producing an electric motor with an electronic control unit is that, by connecting a mechanically stable punched grid with a ceramic substrate in a sandwich construction, very powerful and compact control electronics can be produced in a cost-effective and easily variable process. Because of directly connecting motor components to the control unit, additional process steps are eliminated since additional motor components, such as brush holders, shielding surfaces, connector pins and connections to external electric components, are final mounted when the electronic unit is assembled.

In today's control units, most of the time the logic and power parts are separated from each other structurally. The logic is realized nowadays either on printed circuit boards or ceramic substrates such as LTCC. For the power part, components with housings such as TO220 power MOS transistors can be used on the printed circuit boards in the case of applications with low power consumption, but they require additional heat sinks. In the case of high-current applications such as electric power steering, the power transistors are soldered as bare dice on DBC substrates. The prior art is contacting the upper side of the chip using thick wire bonds. The high space requirements of the bond feet and the restricted current load-carrying capacity, along with reliability problems, limit this technology, in particular for high-current applications. Additional disadvantages of the bonding technology are poor switching behavior due to stray inductances and lacking test concepts for parallel bond loops. Power and logic substrates are wired in control units via additional punched grids and bonding technology. These concepts require a lot of space. The assembly of the electronics, in particular of the power part on heat sinks, such as the housing of the control unit or the end shield of the motor by means of thermally conducting adhesive or foil is not optimal for thermal management.

The requirement for higher integration density and reliability as well as improved thermal management leads to a new concept in assembly and connection technology. The goal on the one hand is combining the logic and power parts with one another while simultaneously optimizing the systems with respect to reliability. As a result, a suitable assembly and connection technology in accordance with the invention is used, which improves both the electrical as well as thermal and thermo-mechanical performance, e.g., by doubled-sided soldering of the power components between suitable wiring supports and direct large-area contacting on heat sinks. This technology in accordance with the invention of double-sided soldering of power components between two substrates into a sandwich is used in this case in order to solder several power transistors, which have both a solderable chip rear side as well as a solderable chip front side, between two substrates (e.g., DBC), which have wiring appropriate for the application. The solderability of the front side of the chip is achieved by applying soldering balls, so-called solder bumps.

Both substrates assume functions of mechanical stabilization, heat dissipation and electrical wiring as well as electrical insulation vis-à-vis cooling surfaces, wherein the DBC substrates are also suitable for high currents.

For applications with smaller currents, the technology in accordance with the invention offers possibilities for miniaturization or integration through a combination of power, logic and sensory technology in one module, whereby potentials for further reducing the costs, particularly the system costs, can be produced.

The objective of the invention is presenting window lifting electronics with the goals of the direct integration into the motor and reduction of costs, construction space as well as the weight as compared to electronics of the prior art.

The core is a mechatronic module based on sandwich technology, which unites all electrical and mechanical functions in it, i.e., it contains power, logic, sensory technology and the substrates required for the sandwich technology as well as the housing.

Because of the concept of sandwich technology and the multifunctional use of the punched grid (first substrate), for example, additional elements for wiring, particularly bonds, can be dispensed with. This is achieved by power components (e.g., power MOSFETs) being glued or soldered between a first substrate, preferably a punched grid (alternatively also DBC=direct bonded copper) and a second substrate, preferably a ceramic substrate, and the control logic of the power part and the sensory mechanism being equipped on the upper side of the second substrate. Contacting the two substrates takes place parallel to contacting the power components between the first and second substrates, thereby producing all electric and mechanical connections within the module. The sandwich structure that is created in this manner is provided with a housing a plastic injection process to protect against environmental influences and mechanical damage.

SUMMARY OF THE INVENTION IN DETAIL a) Miniaturization of the Structure

Advantageous for directly integrating the electronics into the motor is the reduction of the construction space and weight by using sandwich technology and using bare die components for the power and the active logic components, i.e., avoiding pre-packaged components that take up a lot of space. In addition, because of the sandwich structure and the use of bare die components, the dimensions of the substrates can be designed to be smaller as compared with standard technologies, which results in cost advantages despite using a logic substrate that is more expensive as compared with a printed circuit board.

b) Multifunctional Punched Grid as First Substrate

The first substrate, preferably a punched grid, unites a series of functions in it. It is used primarily for electrical contacting of the power components and together with the second substrate for electrical wiring thereof, i.e., to represent the electrical function of the power part. In addition, the punched grid assumes the cooling of the power component, and, as a result, the geometry of the assembly area of the power components is selected in such a way that optimal cooling can occur. For this reason, materials with good electrical and thermal properties are advantageous above all, preferably CU alloys or materials with similar properties. Since a soldering or adhesion process is preferably used as the joining process between the power components and the punched grid, an appropriate surface must be provided for the processes, i.e., when using CU alloys, an additional, i.e., costly, surface such as nickel can be dispensed with in the case of corresponding measures in manufacturing the punched grid. In addition to the appropriate selection of material, additional functions, such as connector pins that can be used for standardized connection systems, can be realized with an appropriate selection of the material thickness.

Additional elements that can be integrated into the punched grid are, for example, spring clips for mounting carbon brushes as well as bore holes for accommodating the module in the application and interfaces for attaching external components or for contacting the motor. The interfaces for the external components, for example, wired capacitors, inductors or stranded wires of carbon brushes, can be incorporated into the design of the punched grid in such a way that the components can be contacted by means of cost-effective joining methods, e.g., nip-clinch technology, i.e., expensive thermal processes like welding can be avoided.

The contacting between punched grid and logic substrate can be accomplished without additional components with appropriate shaping of the punched grid in the area of the contact points, if elevations or depressions are created in the manufacturing process by corresponding mold-dependent fabrication processes, e.g., stamping and punching. In principle, stamping and therefore a reduction in the material thickness with suitable shaping can be used to manufacture spring elements, which are in turn suitable for electrical contacting. In addition, the fabrication processes are suitable for creating contours, which stabilize the punched grid or contribute to sealing the module in connection with the housing. These contours are so-called U-grooves or V-grooves and anker holes such as undercuts, which are simultaneously used to mechanically stabilize the module and therefore guarantee its reliability.

Another functional element is the so-called dam bar, which connects the individual areas of the punched grid to one another before soldering or the injection molding process. The advantage of the dam bar, first of all, is that several individual parts are connected into one easy-to-handle part, whereby the workpiece carriers or the joining aids are also reduced considerably in terms of their complexity. Secondly, the injection molding tool can also be designed more simply as a result.

The functions described in the foregoing can be realized parallel to manufacturing the punched grid since mold-dependent processes like punching, stamping and bending are used to manufacture the punched grid, and the costs incurred are caused essentially by tools, which usually have a high output with quality remaining constant. This means that no additional manufacturing steps, which would incur additional costs as compared to the prior art, are required to achieve the overall function of the punched grid.

c) Logic Substrate as Second Substrate

A logic substrate is preferably used as the second substrate, in which this is a further development of a ceramic substrate. This substrate has several advantages, which make this substrate technology especially attractive for module technology. In contrast to prior art ceramic substrates, this substrate is high-current quality, i.e., the technology is scalable over various power ranges and can also be manufacturing more cost effectively. Especially advantageous in terms of this logic substrate is the universal surface, which is both solderable and adhesible. As a result, it possible to equip the logic components on the front side (logic side) in the form of bare die and SMD using the prior art conductive adhesive technology in order to subsequently connect the pre-equipped component together with the power components and the first substrate both mechanically and electrically in one joining step, preferably a soldering step. In principle, adhesive processes are also conceivable as a joining technology.

The use of standard technology for equipping on the logic side is advantageous in particular for cost reasons since equipping the substrate is possible as a large board, whereby a series of fabrication steps, such as the pressure of the conductive adhesive for example, can take place cost effectively in parallel. In principle, it is also conceivable for the substrate to be equipped not as a large board but as an individual substrate. This variation is required in the case that the substrate is supposed to be connected to begin with to the power part and the first substrate and then with the logic components.

Using a ceramic substrate is advantageous from a technical point of view since the coefficient of expansion of the ceramic is considerably better adapted to silicon and the mold packaging than other substrates, for example printed circuit boards (FR4). Since it is possible to realize so-called vias in this substrate material to represent electrical connections between the front side of the substrate and the rear side of the substrate, additional elements and processes, which produce additional costs and require construction space, can be dispensed with. As a result, a very compact design of the electronics is possible among other things.

d) Symmetrical Structure

The power components as well as the joining points between the power components or punched grid and logic substrate are preferably arranged in such a way that a structure that is as symmetrical as possible results. A symmetrical structure is especially advantageous in the case of thermomechanical stress since it can be assumed that the forces arising are distributed uniformly and thereby improve reliability, i.e., the service life is increased. In addition, a symmetrical structure and short conductive track lengths should also improve the electro-magnetic compatibility behavior. In particular, symmetrical wire routing of the power losses and the connection to the shielding plate is advantageous in order to guarantee an optimal function of the interference suppression components that can be integrated into the module. This sort of structure can be obtained with the technology in accordance with the invention.

e) Integration of Interference Suppression Components into the Module

The integration of any required interference suppression components into the module is advantageous since components are available on the market, for example X2Y, which can assume the interference suppression function and be integrated into the standard equipping process of the logic substrate as SMD components. Because of dispensing with external interference suppression components (as a rule comprised of inductor and capacitor), which are normally wired, additional costly process steps outside the module are eliminated, e.g., welding for contacting the wired components. In addition, construction space advantages are produced because of the elimination of the external components, which as a rule have considerably larger dimensions than SMD components, which is advantageous for the overall integration of the module into the application based on the reduction of the construction space. Eliminating external components also simplifies handling and assembly of the module since the potential danger of damaging these components is eliminated.

f) Use of Bare Die Components

In order to achieve the objective related to miniaturization, it is advantageous to use preferably bare die components, which take up considerably less construction space than the same components in standard housings, for example TO220. Since the overall module is provided with a housing, it is meaningful to avoid costly double packaging of the components.

g) Housing of Low-pressure Epoxy Molding Compound

The execution of the entire module housing in the form a housing manufactured using a transfer molding process is advantageous since the environmentally compatible low-pressure epoxy compounds (so-called green compounds) used for this method are suitable to fill the gaps occurring in the sandwich in a bubble-free manner and protect the electrical components, particularly the bare die components, from environmental influences (e.g., liquids, dust). In addition, the plastics are well suited because of their physical properties to balance out the thermo-mechanical mismatching of the components used. Connected with this is also mechanically stabilizing the sandwich structure. Within the sense of the multifunctional use of the substances and components used in the module structure, the housing can also represent bearing points for external connections (e.g., connector pins or spring clips for carbon brushes) and components, as well as receptacle points of the module in the application. The housing can be formed in an advantageous manner for integrating the module into the application so that geometric marginal conditions resulting from the construction space and functional requirements (e.g., distance of the Hall sensors in the module to the ring magnet in the application) can be taken into account. Since, in contrast to a standard TO220 housing, the same module, i.e., logic and power parts, is completely sheathed and thereby electrically insulated, additional electrically insulating elements such as foils can be dispensed with, whereby both the cost of the insulating material as well as the cost of assembling it can be saved.

h) Parallelized Manufacturing Process

In prior art manufacturing processes, the power components are attached by means of bonding connections, i.e., a sequential manufacturing process. To reduce the manufacturing costs, it is advantageous to replace sequential manufacturing processes with parallel processes. This can be accomplished for the power part by parallel soldering or adhesion of the power components. In the case of the module, the transistors for example are equipped to begin with on a first substrates (punched grid) and then a second substrate (logic substrate) is equipped on the transistors. Both the wiring of the power components as well as the connection process of all electrical contacts of the power components as the well as the first and second substrate takes place parallel to the equipping of the second substrate and the subsequent soldering or adhesion process. The requirement for this type of assembly is that the power components have a solderable or adhesible surface on both sides. Therefore, in the case of power transistors, for example, the gate and source connections are provided with so-called UBM (under bump metallization) and in the case of contacting using soldering also with "solder depots" or bumps. This technology of double-sided soldering is meant to solder power transistors between two DBC (direct bonded copper) substrates. Parallelization on the logic substrate can be achieved for active components by the use of flip clip technology instead of bonding technology, whereby a reduction in the required substrate surface continues to be possible under some circumstances, which has an advantageous effect on the module construction size and the construction space required in the application. Equipping using flip clip technology can be accomplished both in the form of a soldering or adhesion flip chip, preferably as an adhesive connection, however, since this process can be integrated more simply into the standard equipping of the substrate.

i) Mechanical Stabilization of the Module

Additional stabilization of the module can be advantageous depending upon the application and an installation of the electronics (forces on connector pins or connector collars). This can be realized in different embodiments, two of which are described in more detail in the following. In principle, the module can be extrusion coated a second time with another plastic that is distinguished by other mechanical properties as compared with epoxy low-pressure molding compounds. The alternative of extrusion coating is particularly advantageous if the process of plastic extrusion coating is required anyway for the application, for example in manufacturing a housing cover, and extrusion coating the module can be integrated into this process. In this case, no additional processes and tools, which would incur additional costs, are required. Extrusion coating of the model can take place both partially as well as completely.

If no additional extrusion coating process is planned or if extrusion coating the module would lead to an increase in costs from losses in output for technical reasons such as too high a degree of complexity in the injection process, it is advantageous to achieve mechanical stabilization and realize additional functions, such as connector collars or assembly elements to fix the module in the application, in a separate module support. This part can be executed such that it is cost-effective to manufacture and the module can then be mounted simply in this part, for example using a clip connection. This course of action allows costs incurred by the additional part and the additional processes to be minimized.

j) Separately Testable Unit

By integrating all electrical and mechanical functions for triggering and contacting the motor into the module, the module represents an independently testable unit. This is particularly advantageous in the manufacturing flow of the application since in this case no additional assembly processes are required on the module, which might lead to the module being damaged. As a result, no additional cost-intensive intermediate testing is required within the course of manufacturing the application and manufacturing the application can be concluded with one functional test.

k) Embodiments

Because of the possibility of flexibly designing the punched grid, requirements from the application with respect to mechanical and electrical interfaces, e.g., the position of the connector pins or the design of the spring clips can be taken into consideration. This is particularly advantageous in the area of the power connections, if motor contacting cannot be achieved by means of the spring clips created from the punched grid, but by additional components, which assume the function of the spring clip and the receptacle for the brushes. Connecting the spring clips to the module connections can be accomplished for example via rivet or weld connections.

l) Noise Reduction

Integrating the brushes for motor contacting into the module is advantageous in terms of noise development of the motor since the vibrations of the spring clips are not introduced into the motor housing acting as a resonance space, as is the case with the electronics in accordance with the prior art. The vibrations can be isolated by the design of the module or the module housings and the receptacles for the module in the motor housing.

m) Expansion of the Modular Unit

In principle, the described approaches can also be applied to high-current modules, in particular the substitution of the so-called DBC cover substrate by a logic substrate. The use of a logic substrate, preferably the substrate described under c), is advantageous since it makes integrating the control electronics for the power part possible.

The combination of different technologies for manufacturing the electronic unit in accordance with the invention is especially advantageous, such as preferably the use of the substrates described under c), as well as the use of sandwich technology, which required pre-soldered power components, and the direct integration of the electronics into the motor, which presupposes a corresponding interface know-how between the motor and the electronics, in particular in the case of the module with brush springs. Electronics that are executed in the form of modules, i.e., provided with a separate housing and are electrically simple to contact, in principle permit simpler external marketing than electronics that are based on ceramic substrates, which correspond to the prior art. Because of the multi-functional use of components, e.g., the punched grid, the number of steps in the joining process can be reduced, which simultaneously excludes potential points of failure during use, thereby allowing better quality to be expected with regard to shaking stress.

The description of the invention is explained in the following with an example on the basis of a module in sandwich technology consisting of a power and logic part for triggering an electric motor. In doing so, the power part contains an H-bridge consisting of power transistors and the logic part a microprocessor with its external wiring as well as sensory mechanism. In addition, a punched grid is used for example as a first substrate and hybrid ceramics as a second substrate. The basic principles as well as the core and advantages of the invention can be transferred via scaling and adaptation of the structural design to any circuit topologies of the power part and functions of the logic part.

Equipping the logic substrate is performed before the actual construction of the module. Equipping the logic substrate takes place as a large board, on which conductive adhesive is applied to begin with by means of screen printing. Then the large board is equipped with the active and passive components; with passive components in standard SMD technology and with active components with standard die attach (rear side on the first substrate). After the conductive adhesive hardens in a furnace process, the active components are bonded. In principle, it is also possible to equip the active components using flip chip technology. Finally, the dicing of the large board into individual substrates, which are processed in the further module structure, takes place.

The structure of the module begins with the punched grid. Successively stacked on it during assembly of the module, if necessary in a joining device (soldering form), are the solder performs, the pre-soldered power transistors and the pre-quipped logic substrate (individual substrate). Then, the entire stack is joined in a soldering step using lead-free solder such as SnAgCu. As a rule, using soldering paste or other joining methods, e.g., adhesion, is also conceivable. The arrangement of the joining locations shall be selected in such a way that the most symmetrical possible structure results so that tilting of the transistors and substrate does not occur during the joining process, which in the chip area could lead to short circuits or in general to non-uniformly thick joining locations, which reduce, on the one hand, output in manufacturing and reliability of the module, on the other. Since the punched grid is used to cool the transistors, the transistors are preferably soldered with the drain side on the punched grid in order to guarantee optimum cooling of the transistors.

The elements in the punched grid provided for fastening the module in the application, e.g., bore holes, can be used in the fabrication process to accommodate or to fix the punched grid in the joining device.

After soldering, the component is encapsulated using the transfer molding process, in which the component is extrusion coated with plastic in the cavity of a mold, thereby creating the housing of the module. The mold tool is comprised of an upper part and a lower part, which are closed after the component is inserted, and seal the cavity on the punched grid, in particular the so-called dam bar.

This is followed by the actual injection process, which is carried out at a high temperature and high pressure. As soon as the plastic is cross-linked in the tool, the mold is opened and the component is ejected or removed.

Depending upon the plastic used and the requirements for packaging, subsequent hardening in the form of so-called post mold cure (PMC) is possible in a furnace step.

Until after molding, the individual functional elements or regions of the punched grid are connected to each other by means of the dam bar, which allows the punched grid to be handled as one part in the assembly process. This connection requires that all electrical contacts are short circuited, i.e., to produce the electrical function these connection points are separated for example by a punching process. If need be, a bending process for the application-specific design of the electrical and mechanical interfaces to the application can be combined with the punching process.

Depending upon the embodiment of the module, equipping of the module with wired components takes place in the course of final assembly, if necessary, the assembly of separate carbon clips and the connection of the carbon brushes with the carbon clips. In the case that carbon brushes with stranded wires are used, the stranded wires must also be connected to the corresponding connections on the module. Final assembly is concluded with the electrical testing of the unit, which is completely testable at this point in time.

Depending upon the application, the module can be mounted in a different manner in the drive unit, however, with the integration of sensory mechanisms, a special orientation can be required, e.g., that the logic part points in the direction of the motor axle, if, for example, Hall sensors must be positioned via a magnet wheel. In this case, the positioning of the sensors within the module and the positioning of the module in the application must be coordinated. In the process, particularly spacing requirements, for example with Hall sensors, can lead to the housing having contours in the area of the sensors that permit the required spacing to be complied with and at the same time to install components with a greater thickness as compared to the Hall sensors. In the simplest case, the module is mounted without additional measures directly in the application; this can take place for example using screws or pressing. But it is also conceivable for the module to be inserted only into a portion of the housing of the application for example and be fixed by clamping via the assembly of the cover of the application.

In other cases, it can be necessary for the module to be provided with additional functional elements, e.g., connector collars, which cannot be realized with the epoxy low-pressure molding compound because of its mechanical properties. To do this, the module can be partially or completely extrusion coated with a suitable plastic in an additional step before assembly in the application, which step is preferably integrated into a process that is required anyway for manufacturing the housing cover for example. Assembly of the module takes place in this case together with the housing cover. Alternatively, the module can first be mounted on a separately manufactured support, whereby a component with expanded function is generated, which is mounted in the course of the fabrication process of the application. If the functional scope of the module is expanded, it can be advantageous to introduce an additional interim test before final assembly in the application.

In further embodiments of the module, a spring element can be created from one of the external connections, which assumes the contacting with a shielding plate, whereby the shielding plate is a part of the motor housing. The shielding plate is used to shield the brush sparking being generated by the commutator. Contacting the shielding plate takes place preferably during assembly of the module, so that additional joining processes can be dispensed with.

BRIEF DESCRIPTION OF THE DRAWINGS

Different exemplary embodiments of an electric motor in accordance with the invention with a control unit are depicted in the drawings and explained in greater detail in the following description. The drawings show.

DETAILED DESCRIPTION

Figure 1:
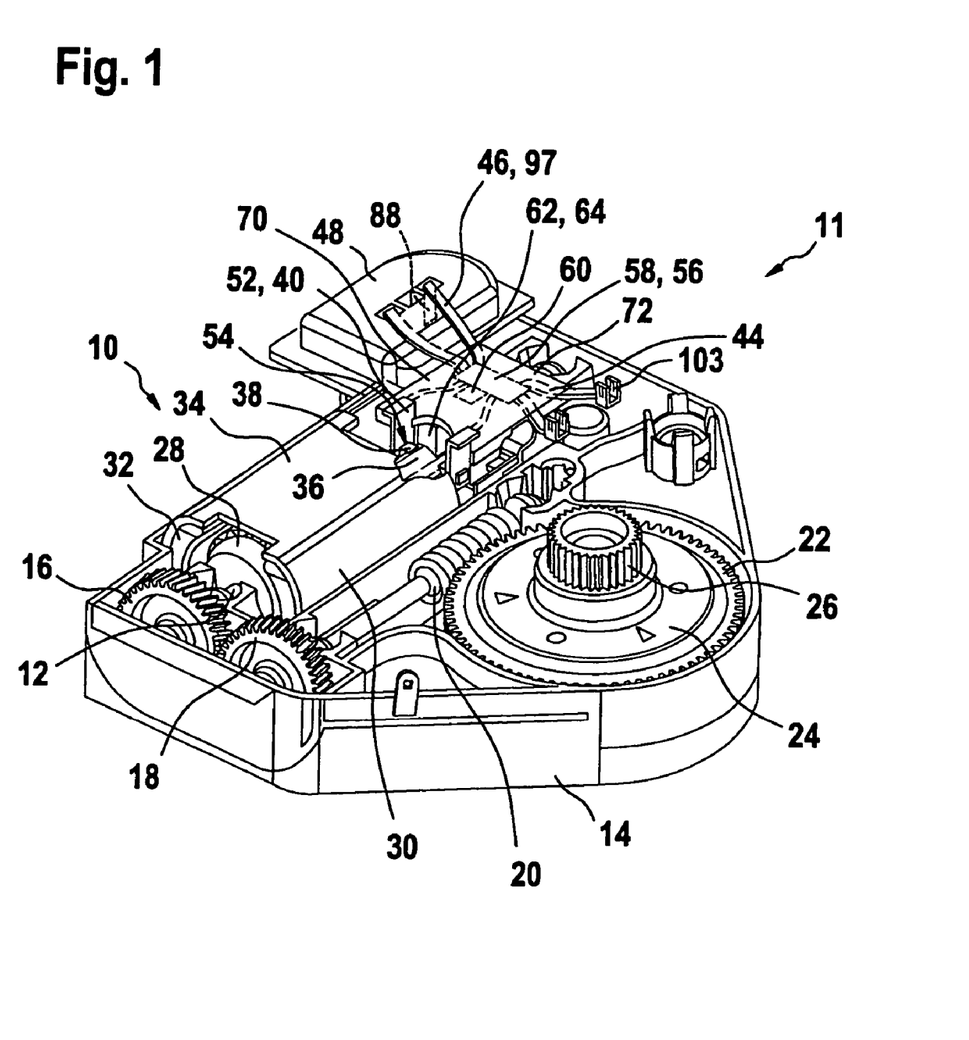
FIG. 1 A perspective representation of an electric motor in accordance with the invention with an opened housing.

FIG. 1 depicts a gear drive unit 11, in which an electric motor 10 with an armature shaft 12 is positioned over its entire length in a first housing part 14. Positioned on the armature shaft 12 is a first gear element 16, which is coupled with second gear element 18 of a separate worm shaft 20. The worm shaft 20 meshes with a worm wheel 22, which further directs the driving torque over a damping device 24 to an output gear 26, which drives a window or a sun roof in a motor vehicle for example. A rotor 28 is arranged on the armature shaft 12 and this rotor can rotate freely within a housing-mounted stator 30. The stator 30 features permanent magnets 32, which are connected with one other by means of a two-part magnetic yoke element 34. The armature shaft 12 features a commutator 36 for energizing purposes, which has a frictional connection with carbon brushes 38, which are connected to an electronic module 70 via spring clips 40. The electronic module 70 has a conductive punched grid 44, whose free ends protrude as extensions 97 from a plastic body 95 that is sprayed on and which form spring clips 40 as well as electrical connections 46 for the housing plug 48 and an electrical as well as mechanical contacting to a shielding plate 104 (not shown in greater detail). In this case, the spring clips 40 are manufactured as leaf springs 52 of copper plate as one piece with the punched grid 44. The spring clips 40 extend from the punched grid 44 tangentially to the collector 36 and have receptacles 54 into which the carbon brushes 38 are firmly inserted. Along with the punched grid 44, 71 on the second substrate 72, the electronic module 70 has various electronic components 56, such as a microprocessor 58 or a position detecting sensors 60, which cooperates with a position transmitter 62 on the armature shaft 12. The electronic module 70 in FIG. 1 is depicted with a cut-away in order to make the collector 36 and the position transmitter 62 embodied as a ring magnet 64 visible. The electrically conductive punched grid 44 with the integrated spring clips 40 is mounted radially to the armature shaft 12 in the first housing part 14, after the gear components 16, 18 and the armature shaft 12 and the stator 30 were mounted radially in the housing part 14. Finally, a cover (not shown) is mounted radially as a second housing part, which closes the first housing part 14.

Figure 2:
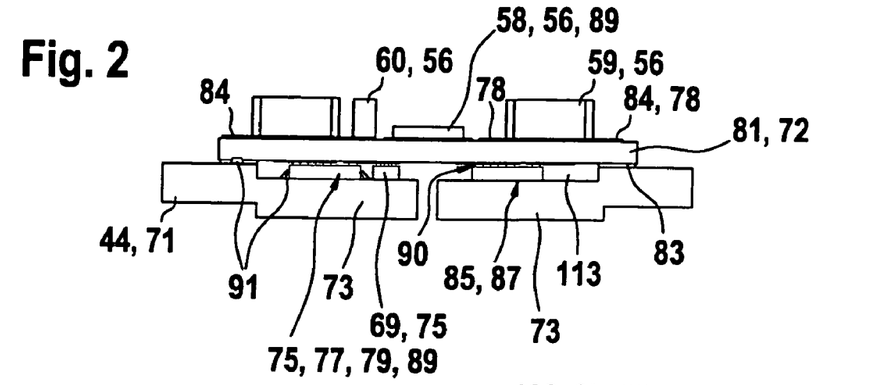
FIG. 2 A schematic section through an electronic unit.

FIG. 2 depicts in more detail the schematic structure of an electronic unit 70 embodied as an electronic module 70 in sandwich technology. A punched grid 44 is formed as a first lower substrate 71, e.g., of a copper plate using punching, bending and stamping with various segments 73. Diodes 69 or transistors 77, for example power MOSFETs 79, are electrically connected on the punched grid 44 as power components 75. Arranged above the power components 75 as second upper substrate 72 is a ceramic substrate 81 with a metallic coating 83, 84 on both sides, which in this case are embodied as conductive tracks 78 made of silver. The power components 75 have electrically conductive contact surfaces 87 (e.g., by means of solder bumps 90) on their lower surface 85 and upper surface 86; these contact surfaces connect them conductively with each of the two substrates 71, 72. The power components 75 are embodied as so-called bare die elements 89, without a plastic housing in order to make a compact layer structure possible. Additional electronic components 56, such as a microprocessor 58, a position sensor 60 and SMD components 59, which together form the logic part 57 to trigger the electric motor 10, are arranged on the coating 84 of the second substrate 72 facing away from the punched grid 44. The second substrate 72 is connected to the first substrate 71 by means of soldering or by means of a conductive adhesive, whereby in an alternative design holding elements 91 are formed on the punched grid 44, by means of which the power components 75 and/or the second substrate 72 are electrically contacted and mechanically fixed on the first substrate 71.

Figure 3:
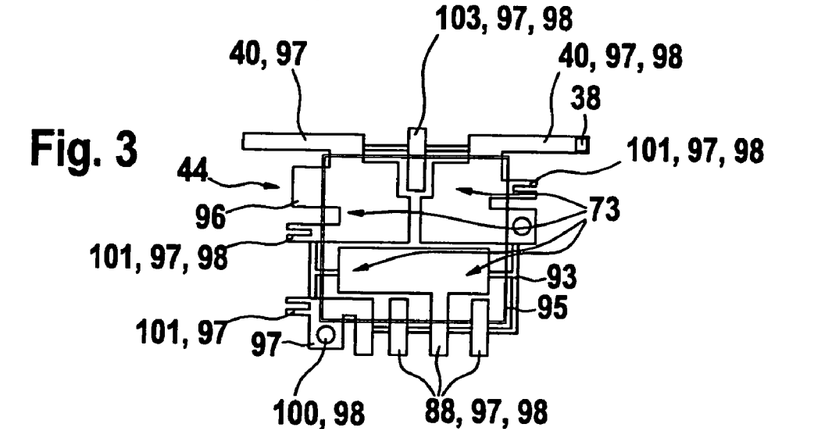
FIG. 3 The schematic outline of the control unit.
Figure 9:
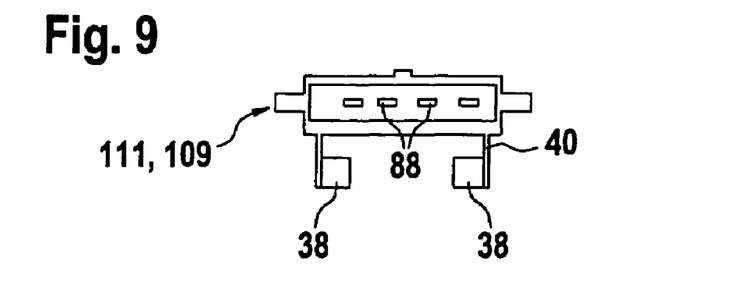

FIG. 3 shows the outline of the punched grid 44, wherein the individual segments 73 are connected with one another via a dam bar 93 in such a way that the punched grid 44 is connected to the second substrate 72 as a contiguous part and then can be extrusion coated with a plastic body 95. In this case, during the injection process the plastic molding compound runs into gaps 113 and voids 113 between the two substrates 71, 72 and the power components 75. The plastic body 95 is dimensioned in this case in such a way that after it is sprayed on, the dam bar 93 can be removed by punching so that the individual segments 73 are no longer connected conductively to one another. Various extensions 97 of the punched grid 44 protrude from the plastic body 95 and these extensions form electrical and mechanical interfaces 98 with other motor components 99. Thus, a portion of the extensions 97 are embodied as connector pins 88 for current and signal connection, other extensions 97 have a receptacle 100 for connecting elements 102, which receptacle can fix the electronic unit 70 on the motor housing 14. Other extensions 97 are embodied as electrical contact points 101 for external electrical components or for carbon stranded wires 76. Two additional extensions 97 are embodied as spring clips 40, on which the carbon brushes 38 are arranged, which cooperate with the collector 36 of the armature shaft 12, as shown in FIG. 9. The spring clips 40 are bent for example with the separation of the dam bar 93 in such a way that the carbon brushes 38 arranged thereupon are adjacent to the collector 36 under initial tension after assembly of the electronic unit 70. A further extension 97 is embodied as an electrical and mechanical connecting piece 103 to a shielding element 104 against electro-magnetic interference. The power elements 75 that are not shown here or other electronic components are arranged on the individual segments 73 in the interior of the plastic body 95.

Figure 4:
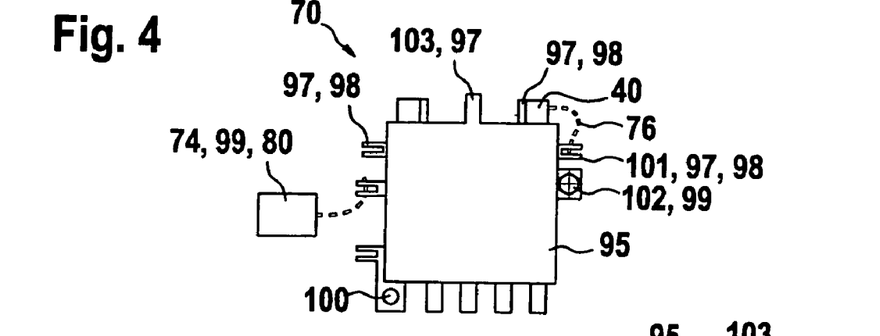
FIGS. 4 and 5 A top view and side view through another exemplary embodiment of a control unit.

FIG. 4 shows a top view of the plastic body 95, which completely encloses the electronic components 56, the power components 75 and the second substrate 72 (as a sprayed on housing 95). Protruding from the plastic body 95 are the extensions 97 as electrical and mechanical interfaces 98 for the motor components 99. Instead of the spring clips 40 embodied as one piece with the extensions 97, in this case, separate spring clips 40, e.g., made of spring steel, are mechanically connected to the extensions 97, e.g., soldered, welded or compressed. The spring clips 40 in this case are used not only to mechanically and resiliently hold the carbon brushes 38, but also to supply current thereto. In an alternative design, carbon stranded wires 76 are also arranged along the spring clips 40, which wires electrically connect the carbon brushes 38 directly to an extension 97 embodied as a contact point 101 for supplying current to the carbon brushes 38 (depicted as a dashed line on the right side). Other contact points 101 form an interface 98 to additional external electrical components 74 such as a capacitor 80 embodied as a electrolytic capacitor 80.

Figure 5:
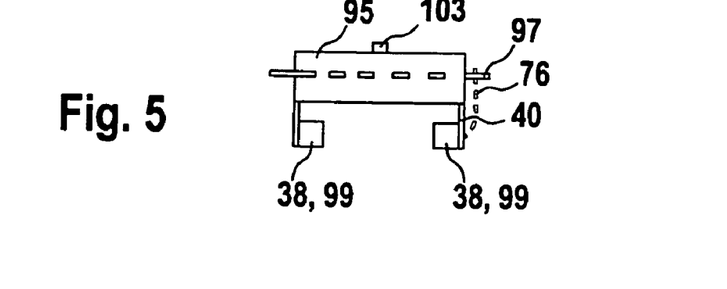

FIG. 5 shows a corresponding section through the electronic unit 70, whereby the spring clips 40 extend essentially perpendicular to the plane of the first substrate 71.

Figure 6:
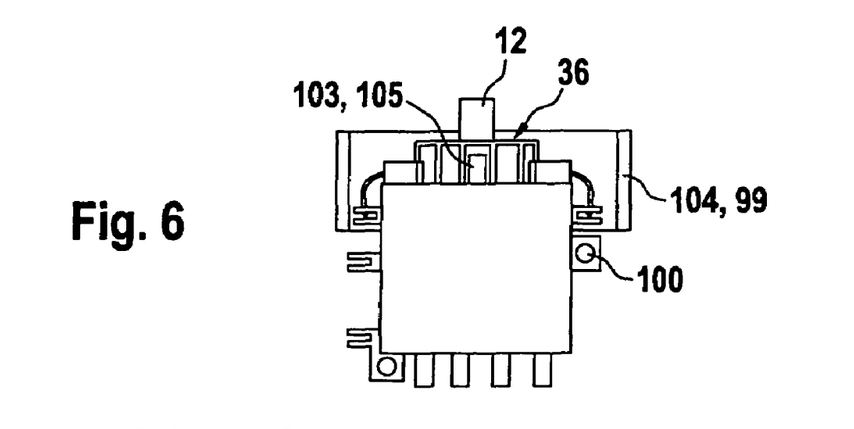
FIGS. 6 and 7 Another exemplary embodiment with a shielding element in accordance with the depiction in FIGS. 4 and 5.
Figure 7:
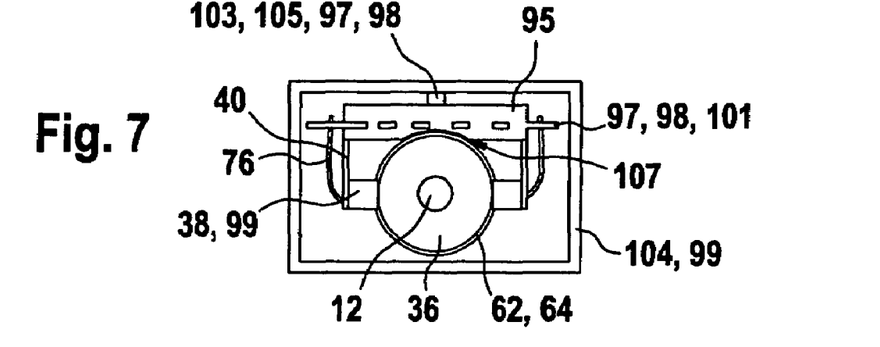

FIGS. 6 and 7 show the electronic unit 70 in a state mounted on the armature shaft 12 in the motor housing 14 (not shown). In this case, the plastic body 95 with the spring slips 40 accommodating the carbon brushes 38 is displaced radially to the armature shaft 12 over the collector 36 until the carbon brushes 38 are adjacent to the collector 36 under initial tension. The electronic unit 70 is then fixed on the housing 14 by means of extensions 97 embodied as fastening elements 100, which cooperate with connecting means 102 for example. A shielding plate 104 to shield against electromagnetic interference is arranged in the area of brush sparking around the collector 36 and the electronic unit 70. For this purpose, the extension 97 embodied as a connecting piece 103 is designed for example as a spring element 105, which is connected to the shielding element 104 during assembly of the electronic unit 70. In a variation of the design, additional housing parts 14 made of metal such as a pole pot as shielding elements 104 can be contacted with the connecting piece 103 or the shielding bodies 104, like the spring clips 40 or the cooling surfaces 96, can also be embodied as one piece with the extensions 97 of the punched grid 44. In order to achieve a minimum distance between the position sensor 60 cast in the plastic body 95 and the position transmitter 62 (e.g., a magnetic ring) arranged on the armature shaft 12, the plastic body 95 is arranged at a small distance directly radially vis-à-vis the position transmitter 62. In the exemplary embodiment, the plastic body 95 in this case has a recess 107 in which the rotating magnetic ring 62 engages, thereby reducing the overall construction height of the electric motor 10.

Figure 8:
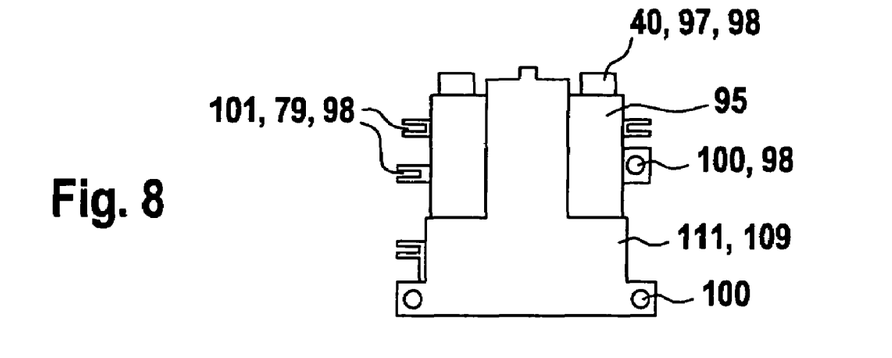
FIGS. 8 and 9 Another variation of an electronic unit in accordance with the depiction in FIGS. 4 and 5.

In another exemplary embodiment in FIGS. 8 and 9, the plastic body 95 is extrusion coated with another plastic part 109, which is embodied here as connector collars 111 for the connector pins 88. In this case, additional receptacles 100 for connecting means 102 are embodied in the external periphery of the pin collar 111 as fastening elements 100, into which the plug 111 and thus the electronic unit 70 can be fixed in the housing part 14.

It must be noted that, with respect to the exemplary embodiments depicted in all the figures, diverse combination possibilities of the individual features among one another are possible. Thus, the selection of the individual motor components 99, the external electrical components 74 or the electronic components 56 of the electronic unit 70 can be adapted to the corresponding application. Instead of extensions 97 embodied as interfaces 98, they can also be embodied as one piece with the corresponding motor components 99 of the external electric components 74. Manufacturing the conductive punched grid 44 is also not restricted to punching, but can also be manufactured using any method that produces a conductive circuit carrier 44. The device in accordance with the invention is preferably used in electrical adjusting drives, in particular for windows and sun roofs. However, the electronic module 70 in accordance with the invention is not limited to the application of a brush motor, but can also be used for EC motors and other actuators, for example for valve controls.

The invention claimed is:

1. Electric motor (10) for adjusting moving parts in a motor vehicle, comprising an electronic unit (70) with a sandwich construction, which contains a first electrically conductive substrate (71) and a second electric conductive substrate (72), between which power components (75) are located and electrically connected to both substrates (71, 72), and a side (84) of the second substrate (72) facing away from the first substrate (71) is equipped with additional electronic components (56), wherein the first substrate (71) is a punched grid (44) punched from a metal material, the punched grid (44) being directly electrically and mechanically connected to the power components (75), the punched grid (44) supporting the power components (75), the punched grid (44) together with the second substrate (72) is extrusion coated with and totally encapsulated by a plastic body (95) produced by injection molding in such a way that only extensions (97) of the punched grid (44) protrude from the plastic body (95), forming an electrical and/or mechanical interface (98) for connecting additional motor components (99, 38, 40, 104, 102, 80).

2. Electric motor (10) according to claim 1, characterized in that the extensions (97) are bore holes (100) of the electronic unit (70).

3. Electric motor (10) according to claim 1, characterized in that the extensions (97) are connector pins (88) or contact points (101) to external electronic components (74) and made of material containing copper.

4. Electric motor (10) according to claim 3, characterized in that the contact points (101) are interfaces (98) using nipclinch technology.

5. Electric motor (10) according to claim 1, characterized in that the motor components (99) are spring clips (40) for accommodating carbon brushes (38).

6. Electric motor (10) according to claim 1, characterized in that the motor components (99) are electro-magnetic shielding bodies (104), which are formed as one piece with the extensions (97).

7. Electric motor (10) according to claim 1, characterized in that holding elements (91) are formed on the punched grid (44), into which the power components (95) and/or the second substrate (72) can be inserted in order to produce an electrical and/or mechanical connection to the punched grid (44).

8. Electric motor (10) according to claim 1, characterized in that a microprocessor (58) and/or a control logic (58) and a position sensory mechanism (60) for an armature shaft (12) of the electric motor (10) are arranged on the second substrate (72) as electronic components (56).

9. Electric motor (10) according to claim 1, characterized in that the second substrate (72) has at least one electrically conductive surface (83, 84), and the electronic components (56) can be equipped variably by means of soldering or conductive adhesion, using flip-chip technology.

10. Electric motor (10) according to claim 1, characterized in that the second substrate (72) has a ceramic plate (81) and at least one conductor track layer (83, 84) on its upper and lower sides, which are connected to one another electrically by means of via holes.

11. Electric motor (10) according to claim 1, characterized in that the power components (75) and/or the components (56) are bare die elements without a housing.

12. Electric motor (10) according to claim 1, characterized in that the power components (75) have a solderable or conductively adhesive surface (85, 86) on both sides, which is provided with solder bumps (90) for soldering technology on the side (86) facing the second substrate (72).

13. Electric motor (10) according to claim 1, characterized in that the power components (75) are power MOSFETs (79).

14. Electric motor (10) according to claim 1, characterized in that the power components (75) are arranged symmetrically for better heat dissipation on the first substrate (71).

15. Electric motor (10) according to claim 1, characterized in that the two substrates (71, 72) are heat sinks, wherein at least one extension (97) of the punched grid (44) is a cooling surface (96) outside the plastic body (95).

16. Electric motor (10) according to claim 1, characterized in that the plastic body (95) is formed on by means of a transfer molding process, wherein epoxy molding compound flows into a gap (113) between the two substrates (71, 72).

17. Electric motor (10) according to claim 1, characterized in that the plastic body (95) is extrusion coated with another plastic of a housing part (14) and/or of a connector collar (111).

18. Electric motor (10) according to claim 1, characterized in that the plastic body (95) is arranged on a separate module support, and fixed by means of a clip connection.

19. Electric motor (10) according to claim 1, characterized in that the electronic unit (70) can be mounted radially to an armature shaft (12) and arranged directly opposite from a commutator (36) and/or a position transmitter (62, 64) of the armature shaft (12), and the plastic body (95) features a formation (107) for adapting to the motor geometry.

20. Electric motor (10) according to claim 1, characterized in that the punched grid (44) is formed from a copper sheet by means of punching, bending and embossing.

21. Electric motor (10) according to claim 1, characterized in that the first substrate (71) is formed of segments (73) connected as a contiguous part and in that, after encapsulated in the plastic body (95), the segments (73) are separated by punching.

22. Electric motor (10) according to claim 1, characterized in that plastic molding compound of the plastic body (95) is arranged in gaps (113) and voids (113) between the substrates (71, 72) and the power components (75).

23. Electrical motor (10) according to claim 1, characterized in that plastic molding compound of the plastic body (95) totally encapsulates the punched grid (44), the second substrate (72), the power components (75), and the electronic components (56).

24. Electrical motor (10) according to claim 1, characterized in that, before encapsulation, the side (84) of the second substrate (74) provides an outer surface and a side of the punched grid (44) facing away from the second substrate (72) provides an opposite outer surface, and that plastic molding compound of the plastic body (95) covers the side (84) of the second substrate (72) and the side of the punched grid (44) facing away from the second substrate (72).

25. Electronic module (70) in a sandwich construction, comprising a first electrically conductive substrate (71) and a second electric conductive substrate (72), between which power components (75) are located and electrically connected to both substrates (71, 72), and a side (84) of the second substrate (72) facing away from the first substrate (71) is equipped with additional electronic components (56), wherein the first substrate (71) is a punched grid (44) punched from a metal material, the punched grid (44) being directly electrically and mechanically connected to the power components (75), the punched grid (44) supporting the power components (75), the punched grid (44) together with the second substrate (72) is extrusion coated with and totally encapsulated by a plastic body (95) produced by injection molding, in such a way that only extensions (97) of the punched grid (44) protrude from the plastic body (95), forming an electrical and/or mechanical interface (98) for connecting additional motor components (99, 38, 40, 104, 102, 80), wherein plastic molding compound of the plastic body (95) is arranged in gaps (113) and voids (113) between the substrates (71, 72) and the power components (75).

* * * * *